United States Patent
Nagashima

(10) Patent No.: US 6,589,619 B1
(45) Date of Patent: *Jul. 8, 2003

(54) RECYCLING METHOD

(75) Inventor: Kazufumi Nagashima, Tokyo-to (JP)

(73) Assignee: Kirin Beer Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/776,702

(22) PCT Filed: Aug. 9, 1995

(86) PCT No.: PCT/JP95/01582

§ 371 (c)(1),
(2), (4) Date: Apr. 10, 1997

(87) PCT Pub. No.: WO96/05111

PCT Pub. Date: Feb. 22, 1996

(30) Foreign Application Priority Data

Aug. 11, 1994 (JP) .............................. 6-189223

(51) Int. Cl.⁷ ................................ B09B 3/00
(52) U.S. Cl. .................... 428/36.6; 428/336; 428/408; 428/421; 428/454; 428/457; 428/458; 428/474.4; 428/480; 428/500; 428/524; 428/903.3
(58) Field of Search .......................... 428/36.6, 36.92, 428/336, 408, 421, 474.4, 480, 500, 524, 35, 7, 903.3; 220/454, 457, 62.12; 427/577, 237, 238, 249

(56) References Cited

U.S. PATENT DOCUMENTS

| | | | | |
|---|---|---|---|---|
| 4,746,538 A | * | 5/1988 | Mackowski | 427/237 |
| 4,756,964 A | * | 7/1988 | Kincaid et al. | 428/408 |
| 4,809,876 A | * | 3/1989 | Tomaswick et al. | 220/458 |
| 5,318,806 A | * | 6/1994 | Montgomery et al. | 427/577 |
| 5,521,351 A | * | 5/1996 | Mahoney | 427/237 |
| 5,529,815 A | * | 6/1996 | Lemelson | 427/577 |
| 5,693,376 A | * | 12/1997 | Fetherston et al. | 427/237 |
| 5,702,770 A | * | 12/1997 | Martin | 427/238 |
| 5,707,691 A | * | 1/1998 | Plester et al. | 427/237 |
| 5,798,139 A | * | 8/1998 | Nagashima et al. | 427/237 |
| 5,976,653 A | * | 11/1999 | Collette et al. | 428/36.7 |
| 6,045,916 A | * | 4/2000 | Shimamura et al. | 428/408 |
| 6,294,226 B1 | * | 9/2001 | Shimamura | 427/577 |

FOREIGN PATENT DOCUMENTS

| | | | | |
|---|---|---|---|---|
| JP | 1-201477 | * | 8/1989 | |
| JP | 2-138469 | * | 2/1990 | |
| JP | H02-70059 | | 3/1990 | ........... C23C/16/26 |
| JP | H02-144574 U | | 12/1990 | ........... B65D/81/24 |
| JP | 3-130363 | * | 4/1991 | |
| JP | 4-304373 | * | 10/1992 | |
| JP | 2000015770 A | * | 1/2000 | |

* cited by examiner

Primary Examiner—Sandra M. Nolan
(74) Attorney, Agent, or Firm—Oblon, Spivak, McClelland, Maier & Neustadt, P.C.

(57) ABSTRACT

A plastic container has a diamond like carbon film 20b formed on the inner surface of the container 20 made of plastic material 20a. The thickness of the diamond like carbon film 20b is within a range from 0.05 to 5 μm. The container 20 coated with the diamond like carbon film can be used for a returnable bottle for beverage.

12 Claims, 15 Drawing Sheets

FIG. 5

| EXPERIMENT NO. | RAW GAS KIND | RAW GAS PRESSURE (Torr) | AUXILIARY GAS KIND | AUXILIARY GAS FLOW RATE (ml/min) | AUXILIARY GAS PRESSURE (Torr) | OUTPUT POWER (W) | AUTO-BIAS (V) | TIME (S) |
|---|---|---|---|---|---|---|---|---|
| 1 | n-HEXANE | 0.04 | NONE | — | — | 400 | −680 | 10 |
| 2 | n-HEXANE | 0.10 | NONE | — | — | 400 | −571 | 10 |
| 3 | n-HEXANE | 0.04 | ARGON | 30 | 0.04 | 400 | −678 | 10 |
| 4 | n-HEXANE | 0.04 | NONE | — | — | 500 | −731 | 10 |
| 5 | n-HEXANE | 0.04 | NONE | — | — | 200 | −466 | 10 |
| 6 | n-HEXANE | 0.02 | NONE | — | — | 400 | −740 | 10 |
| 7 | CYCLOHEXANE | 0.04 | NONE | — | — | 400 | −714 | 10 |
| 8 | BENZENE | 0.04 | NONE | — | — | 400 | −700 | 10 |
| 9 | p-XYLENE | 0.04 | NONE | — | — | 400 | −666 | 10 |
| 10 | n-HEXANE | 0.04 | NONE | — | — | 400 | −683 | 20 |
| 11 | n-HEXANE | 0.02 | ARGON | 30 | 0.02 | 500 | −725 | 10 |
| 12 | n-HEXANE | 0.02 | ARGON | 40 | 0.04 | 500 | −706 | 10 |

FIG. 6

| EXPERIMENT NO. | FILM THICKNESS (Å) | DENSITY (g/cm³) | ADHESION 1 | ADHESION 2 (g) | ALKALI RESISTANCE |
|---|---|---|---|---|---|
| 1 | 1878 | 2.23 | 100/100 | 19.4 | EXCELLENCE |
| 2 | 2756 | 1.88 | 100/100 | 21.7 | EXCELLENCE |
| 3 | 1644 | 2.54 | 100/100 | 19.4 | EXCELLENCE |
| 4 | 2207 | 2.84 | 100/100 | 21.8 | EXCELLENCE |
| 5 | 1531 | 1.61 | 100/100 | 17.7 | EXCELLENCE |
| 6 | 1069 | 2.75 | 100/100 | 19.9 | EXCELLENCE |
| 7 | 1702 | 2.31 | 100/100 | 16.6 | EXCELLENCE |
| 8 | 1761 | 2.42 | 100/100 | 17.0 | EXCELLENCE |
| 9 | 1993 | 2.11 | 100/100 | 19.5 | EXCELLENCE |
| 10 | 4174 | 2.28 | 100/100 | 26.1 | EXCELLENCE |
| 11 | 1001 | 2.64 | 100/100 | 17.7 | EXCELLENCE |
| 12 | 922 | 2.82 | 100/100 | 18.1 | EXCELLENCE |

NOTE 1: ADHESION 1: NUMBER OF CHECKERS WHICH WAS NOT PEELED WITH RESPECT TO 100 CHECKERS.

FIG. 7

| EXPERIMENT NO. | OXYGEN GAS PERMEABILITY (μl/day/pkg) | CARBON DIOXIDE GAS PERMEABILITY (μl/day/pkg) | SORPTION (μg/ppm/bottle) | | | | |
|---|---|---|---|---|---|---|---|
| | | | OCTANE | OCTANAL | OCTANOL | ETHYL HEXANOATE | d-LIMONEN |
| UNTREATED PET BOTTLE | 43.7 | 142.4 | 21.98 | 81.31 | 37.38 | 40.18 | 56.32 |
| 1 | 7.8 | 14.8 | — | — | — | — | — |
| 2 | 6.2 | 12.2 | — | — | — | — | — |
| 3 | 7.5 | 14.4 | — | — | — | — | — |
| 4 | 4.3 | 11.9 | — | — | — | — | — |
| 5 | 8.9 | 15.7 | — | — | — | — | — |
| 6 | 5.6 | 13.6 | — | — | — | — | — |
| 7 | 5.6 | 13.0 | — | — | — | — | — |
| 8 | 5.5 | 12.5 | — | — | — | — | — |
| 9 | 5.4 | 12.6 | — | — | — | — | — |
| 10 | 5.0 | 11.9 | — | — | — | — | — |
| 11 | 5.7 | 14.3 | — | — | — | — | — |
| 12 | 6.0 | 14.0 | — | — | — | — | — |

FIG.10

| EXPERIMENT NO. | RAW GAS | | AUXILIARY GAS | | | OUTPUT POWER (W) | AUTO-BIAS (V) | TIME (S) |
|---|---|---|---|---|---|---|---|---|
| | KIND | PRESSURE (Torr) | KIND | FLOW RATE (ml/min) | PRESSURE (Torr) | | | |
| 1 | n-HEXANE | 0.04 | NONE | — | — | 400 | -688 | 10 |
| 2 | n-HEXANE | 0.10 | NONE | — | — | 400 | -556 | 10 |
| 3 | n-HEXANE | 0.04 | ARGON | 30 | 0.04 | 400 | -670 | 10 |
| 4 | n-HEXANE | 0.04 | NONE | — | — | 500 | -725 | 10 |
| 5 | n-HEXANE | 0.04 | NONE | — | — | 200 | -459 | 10 |
| 6 | n-HEXANE | 0.02 | NONE | — | — | 400 | -733 | 10 |
| 7 | CYCLOHEXANE | 0.04 | NONE | — | — | 400 | -713 | 10 |
| 8 | BENZENE | 0.04 | NONE | — | — | 400 | -695 | 10 |
| 9 | p-XYLENE | 0.04 | NONE | — | — | 400 | -657 | 10 |
| 10 | n-HEXANE | 0.04 | NONE | — | — | 400 | -683 | 20 |
| 11 | n-HEXANE | 0.02 | ARGON | 30 | 0.02 | 500 | -716 | 10 |
| 12 | n-HEXANE | 0.02 | ARGON | 40 | 0.04 | 500 | -700 | 10 |

FIG.11

| EXPERIMENT NO. | FILM THICKNESS (Å) | DENSITY (g/cm³) | ADHESION 1 | ADHESION 2 (g) | ALKALI RESISTANCE |
|---|---|---|---|---|---|
| 1 | 1962 | 2.11 | 100/100 | 25.8 | EXCELLENCE |
| 2 | 2711 | 1.97 | 100/100 | 23.3 | EXCELLENCE |
| 3 | 1698 | 2.62 | 100/100 | 20.6 | EXCELLENCE |
| 4 | 2315 | 2.73 | 100/100 | 29.5 | EXCELLENCE |
| 5 | 1457 | 1.54 | 100/100 | 26.6 | EXCELLENCE |
| 6 | 1112 | 2.66 | 100/100 | 27.7 | EXCELLENCE |
| 7 | 1776 | 2.21 | 100/100 | 19.3 | EXCELLENCE |
| 8 | 1809 | 2.65 | 100/100 | 22.5 | EXCELLENCE |
| 9 | 2076 | 2.23 | 100/100 | 24.4 | EXCELLENCE |
| 10 | 4003 | 2.19 | 100/100 | 31.9 | EXCELLENCE |
| 11 | 954 | 2.88 | 100/100 | 22.1 | EXCELLENCE |
| 12 | 1011 | 2.94 | 100/100 | 24.1 | EXCELLENCE |

NOTE 1: ADHESION 1: NUMBER OF CHECKERS WHICH WAS NOT PEELED WITH RESPECT TO 100 CHECKERS.

FIG.12

| EXPERIMENT NO. | OXYGEN GAS PERMEABILITY (μl/day/pkg) | CARBON DIOXIDE GAS PERMEABILITY (μl/day/pkg) | SORPTION (μg/ppm/bottle) | | | | |
|---|---|---|---|---|---|---|---|
| | | | OCTANE | OCTANAL | OCTANOL | ETHYL HEXANOATE | d-LIMONEN |
| UNTREATED PAN BOTTLE | 33.8 | 119.8 | 3.64 | 4.01 | 9.55 | 6.16 | 10.32 |
| 1 | 2.2 | 7.8 | — | — | — | — | — |
| 2 | 1.9 | 6.5 | — | — | — | — | — |
| 3 | 2.5 | 6.7 | — | — | — | — | — |
| 4 | 1.4 | 3.2 | — | — | — | — | — |
| 5 | 2.2 | 9.6 | — | — | — | — | — |
| 6 | 2.0 | 5.3 | — | — | — | — | — |
| 7 | 1.9 | 6.1 | — | — | — | — | — |
| 8 | 1.7 | 6.0 | — | — | — | — | — |
| 9 | 1.6 | 5.4 | — | — | — | — | — |
| 10 | 1.0 | 5.2 | — | — | — | — | — |
| 11 | 1.3 | 7.1 | — | — | — | — | — |
| 12 | 1.6 | 7.3 | — | — | — | — | — |

FIG.13

| EXPERIMENT NO. | RAW GAS KIND | RAW GAS PRESSURE (Torr) | AUXILIARY GAS KIND | AUXILIARY GAS FLOW RATE (ml/min) | AUXILIARY GAS PRESSURE (Torr) | OUTPUT POWER (W) | AUTO-BIAS (V) | TIME (S) |
|---|---|---|---|---|---|---|---|---|
| 1 | n-HEXANE | 0.04 | NONE | — | — | 400 | −677 | 10 |
| 2 | n-HEXANE | 0.10 | NONE | — | — | 400 | −571 | 10 |
| 3 | n-HEXANE | 0.04 | ARGON | 30 | 0.04 | 400 | −692 | 10 |
| 4 | n-HEXANE | 0.04 | NONE | — | — | 500 | −755 | 10 |
| 5 | n-HEXANE | 0.02 | NONE | — | — | 200 | −476 | 10 |
| 6 | n-HEXANE | 0.04 | NONE | — | — | 400 | −721 | 10 |
| 7 | CYCLOHEXANE | 0.04 | NONE | — | — | 400 | −719 | 10 |
| 8 | BENZENE | 0.04 | NONE | — | — | 400 | −696 | 10 |
| 9 | p-XYLENE | 0.04 | NONE | — | — | 400 | −670 | 10 |
| 10 | n-HEXANE | 0.04 | NONE | — | — | 400 | −691 | 20 |
| 11 | n-HEXANE | 0.02 | ARGON | 30 | 0.02 | 500 | −728 | 10 |
| 12 | n-HEXANE | 0.02 | ARGON | 40 | 0.04 | 500 | −700 | 10 |

FIG.14

| EXPERIMENT NO. | FILM THICKNESS (Å) | DENSITY (g/cm³) | ADHESION 1 | ADHESION 2 (g) | ALKALI RESISTANCE |
|---|---|---|---|---|---|
| 1 | 1978 | 2.33 | 100/100 | 26.5 | EXCELLENCE |
| 2 | 3005 | 1.95 | 100/100 | 27.2 | EXCELLENCE |
| 3 | 1891 | 2.61 | 100/100 | 26.4 | EXCELLENCE |
| 4 | 2564 | 2.81 | 100/100 | 27.5 | EXCELLENCE |
| 5 | 1611 | 1.72 | 100/100 | 24.3 | EXCELLENCE |
| 6 | 1322 | 2.77 | 100/100 | 22.1 | EXCELLENCE |
| 7 | 1883 | 2.29 | 100/100 | 20.0 | EXCELLENCE |
| 8 | 1926 | 2.44 | 100/100 | 23.3 | EXCELLENCE |
| 9 | 2079 | 2.08 | 100/100 | 28.9 | EXCELLENCE |
| 10 | 4537 | 2.35 | 100/100 | 31.1 | EXCELLENCE |
| 11 | 1147 | 2.71 | 100/100 | 22.5 | EXCELLENCE |
| 12 | 1005 | 2.81 | 100/100 | 25.2 | EXCELLENCE |

NOTE 1: ADHESION 1: NUMBER OF CHECKERS WHICH WAS NOT PEELED WITH RESPECT TO 100 CHECKERS.

FIG. 15

| EXPERIMENT NO. | OXYGEN GAS PERMEABILITY (μl/day/pkg) | CARBON DIOXIDE GAS PERMEABILITY (μl/day/pkg) | SORPTION (μg/ppm/bottle) | | | | |
|---|---|---|---|---|---|---|---|
| | | | OCTANE | OCTANAL | OCTANOL | ETHYL HEXANOATE | d-LIMONEN |
| UNTREATED COC BOTTLE | 362.5 | 566.9 | 121.54 | 95.82 | 33.61 | 62.59 | 181.91 |
| 1 | 39.7 | 60.8 | — | — | — | — | — |
| 2 | 31.1 | 51.9 | — | — | — | — | — |
| 3 | 42.5 | 57.7 | — | — | — | — | — |
| 4 | 22.3 | 42.3 | — | — | — | — | — |
| 5 | 46.8 | 66.7 | — | — | — | — | — |
| 6 | 33.3 | 60.0 | — | — | — | — | — |
| 7 | 31.8 | 56.4 | — | — | — | — | — |
| 8 | 29.5 | 50.1 | — | — | — | — | — |
| 9 | 28.4 | 43.9 | — | — | — | — | — |
| 10 | 26.6 | 42.2 | — | — | — | — | — |
| 11 | 30.0 | 52.5 | — | — | — | — | — |
| 12 | 30.7 | 54.6 | — | — | — | — | — |

RECYCLING METHOD

TECHNICAL FIELD

This invention relates to a plastic container, the inner surface of which is coated with a hard carbon film.

BACKGROUND ART

In general, plastic containers are widely used as packaging materials in various kinds of fields such as a food field and a medicine field because plastic containers have various benefits which are easy to mold, light in weight and low in cost. However, as is well known, plastic permits low molecular gas, such as oxygen and carbon dioxide, to permeate therethrough, and furthermore, plastic sorbs (i.e., both of absorption and adsorption occur simultaneously) inside therein low molecular organic compound, namely, low molecular organic compound infiltrates into the plastic composition and diffuses therein in such a manner that the low molecular organic compound is absorbed inside the plastic. Therefore, plastic containers are restricted in many aspects to specific objects and forms in use in comparison with other containers such as a glass container.

For example, in case that a carbonated beverage such as beer is filled into a plastic container, oxygen in the atmosphere permeates the wall of the plastic container to reach inside the plastic container, thus gradually oxidizing and deteriorating the beverage contained therein. In addition, carbon dioxide gas in the carbonated beverage permeates, in reverse, the wall of the plastic container and is released off toward outside, thus the carbonated beverage loses its savor.

Further, in case that beverages having aroma component such as orange juice are filled into a plastic container, aroma component (such as limonene in the case of the orange juice) which is a low molecular organic compound is sorbed inside the plastic. Consequently, chemical composition of the aroma components in the beverages may lose its balance to deteriorate the beverages in quality.

In addition, a plastic container may have a problem that low molecular compound contained in the plastic container dissolves in a liquid content contained in the container. More specifically, in case that content (especially, liquid) requiring a high purity is filled into the container, plasticizer, residual monomer or other additives dissolves out of the container into the liquid content, thus deteriorating purity of the content.

Furthermore, at present, how large numbers of used containers are to be treated has become a social issue, and collecting the used containers for the sake of recycling resources is in progress. However, when a used plastic container is to be used as a recycled container, if the used plastic container is left in the environment before being collected, various low molecular organic compounds, such as those producing mold odor, are sorbed in the plastic container, something that does not happen with glass containers. The low molecular organic compounds thus sorbed in the plastic container remain in the plastic even after the container is washed. The sorbed low molecular organic compounds gradually dissolve out of the plastic into the contents of the plastic container as impurities, thereby deteriorating the contents in quality and causing a hygienic problem. As a result, plastic containers can be hardly used as returnable containers, namely, containers collected to be reused.

In order to suppress the above-mentioned features of the plastic, namely, the feature of permitting low molecular gas to permeate therethrough or the feature of sorbing low molecular organic compound therein, crystals in the plastic have been oriented to enhance crystallinity or thin sheets of plastic having a lower sorption or thin films of aluminum have been laminated. In either methods, however, problems of gas barrier property and the sorption of low molecular organic compound cannot be perfectly solved while maintaining the basic properties of the plastic container.

Recently, there has appeared a thin film forming technology for a DLC (Diamond like carbon) film and it is known that laboratory tools such as beakers and flasks are coated with the DLC film. The DLC film comprises amorphous carbon including mainly $SP^3$ bond between carbons. The DLC film is a hard carbon film which is very hard, and has a good insulation, a high index of refraction and a smooth morphology.

Japanese Patent Provisional Publication No. 2-70059 discloses an example in which the DLC film forming technology is applied to laboratory tools for coating thereof. An apparatus for forming the DLC film disclosed in the above publication comprises the followings. As shown in FIG. 16, a cathode 2 is disposed in a reaction chamber 1 having an inlet 1A for carbon resource gas which generates carbon or is converted to carbon and an outlet 1B, and a laboratory tool 3 such as a beaker is accommodated in a space 2A formed in the cathode 2. The reaction chamber 1 is decompressed by discharging air from the outlet 1B after an earthed anode 4 is inserted into an inner space of the laboratory tool 3. After the carbon resource gas is led into the reaction chamber 1 from the inlet 1A, a high frequency is impressed on the cathode 2 from a high frequency power source 5 to excite the carbon resource gas, thus generating plasma to form the DLC film on the surfaces of the laboratory tool 3.

However, in the above DLC film forming apparatus, the reaction chamber 1 accommodates the cathode 2 and the anode 4, so that the volume of the reaction chamber 1 is remarkably large in comparison with that of the laboratory tool 3 to be coated. Therefore, it causes wastes of time and energy for a vacuum operation of the reaction chamber. Furthermore, since the film forming speed (rate) in the above DLC film forming apparatus is 10 to 1000 Å per minute, which speed is slow, there is a problem in which it is difficult to continuously form the film at a low cost.

The conventional DLC film forming apparatus described above is applied to laboratory tools such as beakers and flasks so as to mainly further increase their qualities, so that the manufacturing cost and time thereof is not much considered. However, containers used for beverages such as beer and orange juice must be manufactured in large quantities at low cost. Accordingly, the DLC film forming apparatus cannot be applied to the containers used for beverages.

In the above DLC film forming apparatus, since the carbon resource gas moves into the space between the inner surface of the cathode 2 and the outer surface of the laboratory tool 3 to be coated, it is impossible to coat only the inner surface of the laboratory tool 3.

Containers for beverages often collide with each other during the manufacturing process in a factory or during the selling process in a store, unlike a laboratory tool such as a beaker or a flask. When a DLC film is formed on the outer surface of a container for beverages, the DLC film itself is damaged by the collisions to decrease the value of merchandise in the containers. Accordingly, it is required that the DLC film is formed only on the inner surface of a container.

It is an object of this invention to provide a plastic container coated with carbon film which can solve the problems of gas barrier property and sorption inherently owned by the plastic while maintaining basic properties of plastic, which can be returnably used to extend the fields and the forms in which plastic containers can be used, which can be continuously manufactured at a low cost, and which is not damaged during handling of the containers.

DISCLOSURE OF INVENTION

In order to attain the above object, a plastic container of this invention comprises a bottle for beverages made of a plastic material with a hard carbon film formed only on an inner surface thereof. In addition, the hard carbon film comprises a diamond like carbon film.

According to the above plastic container of the invention, permeability of the container against low molecular inorganic gas such as oxygen and carbon dioxide can be remarkably lowered, and furthermore, the sorption in the plastic of various low molecular organic compounds having a smell can be completely suppressed. The formation of the hard carbon film does not deteriorate the transparency of the plastic container.

The hard carbon film preferably comprises a diamond like carbon film. The diamond like carbon film is a kind of hard carbon film which is called i-carbon film or hydrogenated amorphous carbon film, and is amorphous carbon film mainly including $SP^3$ bond.

Furthermore, the thickness of the diamond like carbon film is preferably within a range of 0.05–5 $\mu$m. With the thickness of the diamond like carbon film limited to the above range, adhesive property of the film to plastic material, the durability and transparency and the like of the container can be obtained, and in addition, the sorption in the plastic of low molecular organic compound can be effectively suppressed and gas barrier property of the container can be improved.

The following resins are used as plastic material for containers. Polyethylene resin, polypropylene resin, polystyrene resin, cycloolefine copolymer resin, polyethylene terephthalate resin, polyethylene naphthalate resin, ethylene-(vinyl alcohol) copolymer rein, poly-4-methyl pentene-1 resin, poly (methyl methacrylate) resin, acrylonitrile resin, polyvinyl chloride resin, polyvinylidene chloride resin, styrene-acrylonitrile resin, acrylonitrile-butadienstyrene resin, polyamide resin, polyamideimide resin, polyacetal resin, polycarbonate resin, polybutylene terephthalate resin, ionomer resin, polysulfone resin and polytetra fluoroethylene resin.

Furthermore, the thickness of the diamond like carbon film is preferably within a range of 0.05–5 $\mu$m. With the thickness of the diamond like carbon film limited to the above range, adhesive property of the film to plastic material, the durability and transparency and the like of the container can be obtained, and in addition, the sorption in the plastic of low molecular organic compound can be effectively suppressed and gas barrier property of the container can be improved.

The following resins are used as plastic material for containers. Polyethylene resin, polypropylene resin, polystyrene resin, cycloolefine copolymer resin, polyethylene terephthalate resin, polyethylene naphthalate resin, ethylene-(vinyl alcohol) copolymer resin, poly-4-methyl pentene-1 resin, poly (methyl, methacrylate) resin, acrylonitrile resin, polyvinyl chloride resin, polyvinylidene chloride resin, styrene-acrylonitrile resin, acrylonitrile-butadienstyrene resin, polyamide resin, polyamideimide resin, polyacetal resin, polycarbonate resin, polybutylene terephthalate resin, ionomer resin, polysulfone resin and polytetra fluoroethylene resin.

When the plastic container with a hard carbon film formed on an inner surface thereof is applied to a bottle for beverages, the plastic container can be returnably used in place of a conventional glass container.

As described above, the plastic container coated with a hard carbon film of the invention has an excellent gas barrier property and can completely suppress the sorption in the plastic of low molecular organic compound such as odor component, thus making it possible that the container is extensively used as a packaging container in various many fields and as a returnable container capable of refilling therein. Furthermore, since the hard carbon film is formed only on the inner surface of the container in the invention, there is no concern over the damage of the formed hard carbon film during handling of the container.

In case that the hard carbon film formed on the inner surface of the container comprises a diamond like carbon film, the above-mentioned effects become more remarkable.

BRIEF DESCRIPTION OF THE DRAWINGS

FIG. 5 is a table showing conditions for forming hard carbon film;

FIG. 6 is a table showing results evaluating thickness of film and the like of hard carbon film formed under the conditions shown in FIG. 5;

FIG. 7 is a table showing results evaluating oxygen permeability and the like of the hard carbon film formed under the conditions shown in FIG. 5;

FIG. 10 is a table showing other conditions for forming the hard carbon film;

FIG. 11 is a table showing results evaluating thickness and the like of hard carbon film formed under the conditions shown in FIG. 10;

FIG. 12 is a table showing results evaluating oxygen permeability and the like of the hard carbon film under the conditions shown in FIG. 10;

FIG. 13 is a table showing further other conditions for forming the hard carbon film;

FIG. 14 is a table showing results evaluating thickness and the like of the hard carbon film formed under the conditions shown in FIG. 13;

FIG. 15 is a table showing results evaluating permeability and the like of the hard carbon film formed under the conditions shown in FIG. 13.

BEST MODE FOR CARRYING OUT THE INVENTION

Embodiments of the invention is explained with reference to drawings.

Figure 1:
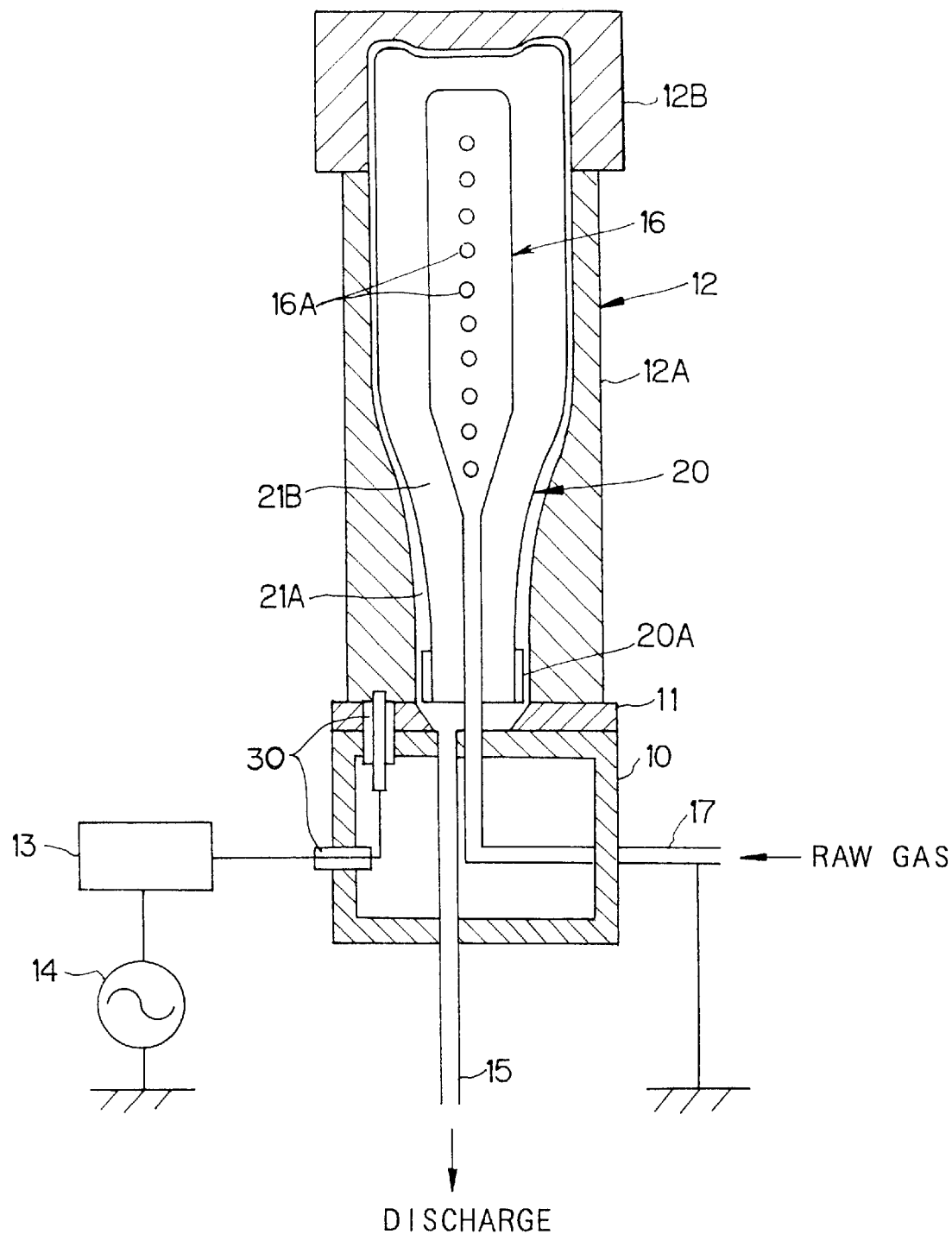
FIG. 1 is a longitudinally sectional view showing an embodiment of a manufacturing apparatus for manufacturing a plastic container coated with carbon film according to this invention.

FIG. 1 shows a manufacturing apparatus for manufacturing a plastic container coated with carbon film according to the invention. The manufacturing apparatus has a ceramic insulating plate 11 fixed on a base 10, on which insulating plate an external electrode 12 is mounted. The external electrode 12 itself serves at the same time as a vacuum chamber for forming a DLC film, inside of which external electrode a space is formed for accommodating a container 20 to be coated. The space formed in the external electrode 12 is slightly larger than the container 20 accommodated therein. In this embodiment, the container 20 is a bottle for beverage, however, the container may be used for other objects.

The external electrode 12 comprises a main body 12A and a cover 12B provided detachably on the main body 12A so as to tightly close the interior of the main body 12A. A high frequency power source 14 is connected to the lower portion of the external electrode 12 through a matching device 13 and connecting members 30, 30 provided on the base 10. Furthermore, a discharging pipe 15 is communicated as shown in FIG. 1 with the space formed in the external electrode 12 so as to discharge air in the space by a vacuum pump not shown.

An internal electrode 16 is inserted into the space of the external electrode 12 so as to be disposed at the center portion of the space. The discharging pipe 15 terminates at the upper surface of the base 10 so as to be opened to a circular space 11B formed at the center portion of the insulating plate 11. The internal electrode 16 is so formed that the electrode 16 can be inserted into the container 20 through the mouth 20A of the container 20, and the external shape of the internal electrode 16 is approximately similar figures to the internal shape of the container 20. It is preferable that the distance between the external electrode 12 and the internal electrode 16 is kept approximately even at every position of the container 20 within the range of 10–150 mm.

A feed pipe 17 for feeding raw gas is connected with the internal electrode 16. A raw gas is fed through a gas flow rate controller (not shown) from the feed pipe 17 for feeding raw gas into the internal electrode 16. The raw gas thus fed into the internal electrode 16 blows off from a plurality of blowing openings 16A formed on the internal electrode 16. A plurality of blowing openings are preferably formed on the side portion of the internal electrode 16 as shown in FIG. 1 in order to evenly diffuse the blown raw gas. However, in case that the raw gas is evenly diffused immediately after being blown off from the internal electrode 16, one blowing opening may be formed on the top of the internal electrode 16. The internal electrode 16 is earthed through the feed pipe 17 for the raw gas.

Figure 2:
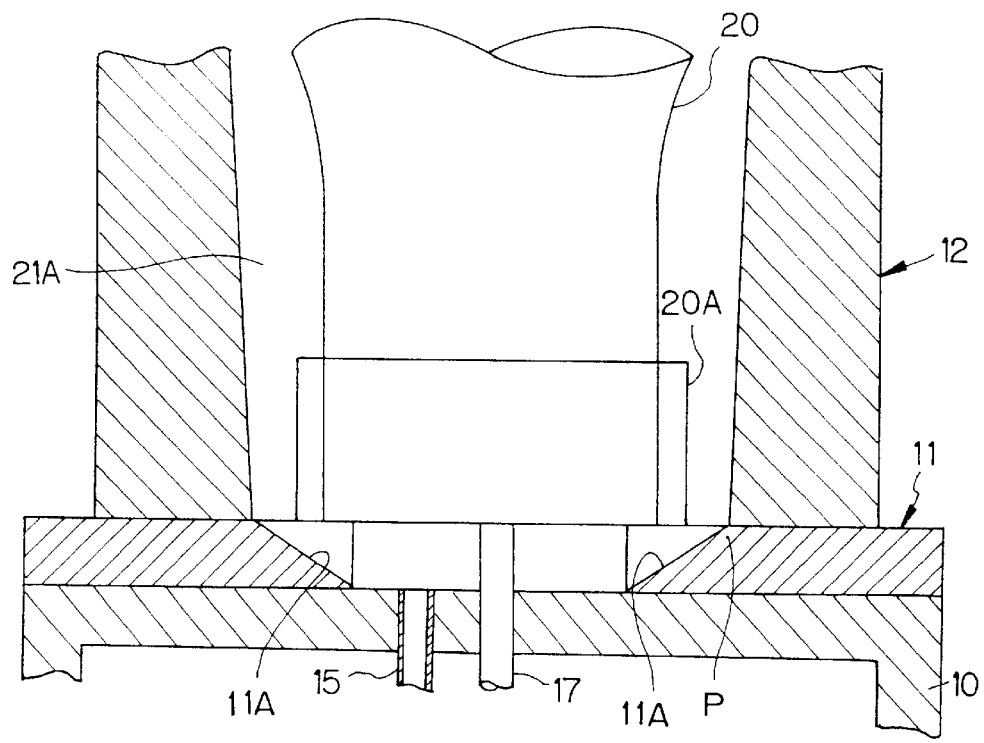
FIG. 2 is a partially enlarged sectional view of the above embodiment.
Figure 3:
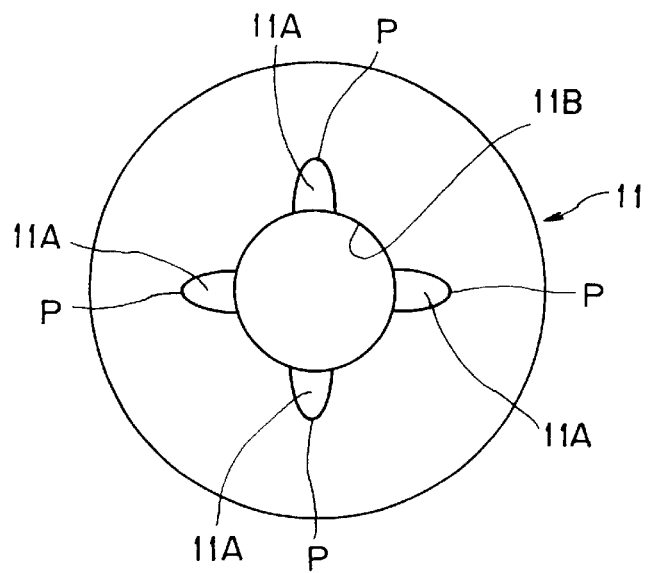
FIG. 3 is a plan view of an insulating plate of the above embodiment.

The insulating plate 11 comprises a short cylindrical body having an outer circumferential surface and an inner circumferential surface, and has a plurality of grooves 11A (four grooves in this embodiment) as enlargedly shown in FIGS. 2 and 3. Each of the grooves 11A is disposed at an angular interval of 90° and the bottom surface of each groove 11A is slanted downwardly from an abutting point P (FIG. 2) to the inner circumferential surface of the insulating plate 11, at which abutting point an inner circumferential surface of the external electrode 12 is abutted on the insulating plate 11. As shown in FIG. 2, an external space 21A formed between the inner surface of the external electrode 12 and the outer surface of the container 20 is communicated with the discharging pipe 15 through the grooves 11A in a state wherein the container 20 is accommodated in the external electrode 12 with the mouth 20A of the container 20 abutted against the insulating plate 11.

Then, a method for forming a DLC film by the above manufacturing apparatus is explained.

The plastic container 20 is inserted from the upper opening of the main body 12A into the external electrode 12 with the cover 12B detached from the main body 12A. At this time, the internal electrode 16 is inserted into the container 20 through the mouth 20A of the container 20. Then, the mouth 20A is abutted against the insulating plate 11 in such manner that the plastic container 20 is placed in an appropriate position in the external electrode 12, and the cover 12B then closes the upper opening of the main body 12A so that the external electrode 12 is tightly sealed. At this time, the distance between the inner surface of the external electrode 12 and the outer surface of the container 20 is maintained approximately even while the distance between the inner surface of the container 20 and the outer surface of the internal electrode 16 is maintained approximately even.

Thereafter, air in the external electrode 12 is discharged through the discharging pipe 15 by a vacuum pump so that the inside of the external electrode 12 becomes vacuum. More specifically, the internal space 21B as well as the external space 21A between the outer surface of the container 20 and the inner surface of the external electrode 12 becomes vacuum by means of the grooves 11A formed in the insulating plate 11. This is because unless the external space 21A is vacuum, the temperature in the external space 21A becomes remarkably high upon generating plasma, thus affecting the plastic material of the container 20.

The degree of vacuum is preferably within a range from $10^{-2}$ to $10^{-5}$ torr. With a lower degree of vacuum of over $10^{-2}$ torr, impurities in the container are much increased, on the other hand, with a higher degree of vacuum under $10^{-5}$ torr, a long time and a large energy are needed to discharge the air in the container 20.

Then, the raw gas as carbon resource is supplied to the feed pipe 17 through the gas flow rate controller not shown in the drawing, and then thus supplied raw gas is blown off through the blow openings 16A into the internal space 21B in the state of vacuum between the outer surface of the internal electrode 16 and the inner surface of the container 20. The flow rate of the raw gas is preferably within a range from 1 to 100 ml/min, by which flow rate of the raw gas the pressure in the internal space 21B is adjusted within the range from 0.5 to 0.001 torr.

Since the air in the external space 21A is discharged through the grooves 11A, the pressure in the external space 21A becomes lower slightly later than the pressure in the internal space 21B becomes lower. Therefore, when the discharge of the air is just started, the pressure in the external space 21A is slightly higher than the pressure in the internal space 21B. Accordingly, in the case that the supply of the raw gas get started immediately after the discharge of the air in the container is over, the raw gas blown into the internal space 21B does not get into the external space 21A.

Aliphatic hydrocarbons, aromatic hydrocarbons, oxygen containing hydrocarbons, nitrogen containing hydrocarbons, etc., in gaseous or liquid state at a room temperature are used as the raw gas. Especially, benzene, toluene, o-xylene, m-xylene, p-xylene and cyclohexane each having six or more than six carbons are preferable. These raw gases may be used per se, however, mixture of two or more than two kinds of raw gases may be used. Furthermore, these gases may be used in the state of dilution with inert gas such as argon and helium.

After the supply of the raw gas into the container, electric power is impressed to the external electrode 12, via the matching device 13, from the high frequency electric source 14. The impression of the electric power generates plasma between the external electrode 12 and internal electrode 16. At this moment, the internal electrode 16 is earthed, however, the external electrode 12 is insulated by the insulating plate 11. Therefore, negative self-bias is generated at the external electrode 12. This causes a DLC film to be uniformly formed on the inner surface of the container 20.

More specifically, the formation of the DLC film on the inner surface of the container 20 is performed by means of an improved plasma CVD method. In case that a low temperature plasma is used in the plasma CVD method, the temperature upon forming the DLC film can be set relatively low. Therefore, the low temperature plasma is suitable in case that an article having a low thermal resistance such as plastic is used as a substrate, and furthermore, the low temperature plasma enables the DLC film to be formed on a wide area at a relatively low cost.

The low temperature plasma is a plasma in the non-equilibrium state in which electron temperature is high in the plasma and temperatures of ion and neutral molecule are remarkably low in comparison with the temperature of the electron in case that the interior of the reaction chamber is maintained at a low pressure.

When the plasma is generated between the external electrode 12 and the internal electrode 16, electrons are accumulated on the inner surface of the insulated external electrode 12 to electrify negatively the external electrode 12, namely, to generate negative self-bias on the external electrode 12. At the external electrode 12, a voltage drop occurs at a range from 500 to 1,000V because of the accumulated electrons. At this time, carbon dioxide as the carbon resource exists in the plasma, and positively ionized carbon resource gas is selectively collided with the inner surface of the container 20 which is disposed along the external electrode 12, and, then, carbons close to each other are bonded together thereby to form hard carbon film comprising remarkably dense DLC film on the inner surface of the container 20. The hard carbon film of the DLC film is also called as i-carbon film or hydrogenated amorphous carbon film (a-C:H) and is an amorphous carbon film including mainly $SP^3$ bond.

The thickness of DLC film is varied by an output of high frequency, a pressure of the raw gas in the container 20, a gas flow rate for feeding, period of time during which plasma is generated, self-bias and kind of raw material and the like. However, the thickness of DLC film is preferably within a range from 0.05 to 5 µm to obtain the effective suppression of the sorption of the low molecular organic compound and the improved gas barrier property, in addition to an excellent adhesion to plastic, a good durability and a good transparency. Quality of the DLC film is varied by output of the high frequency, the pressure of the raw gas in the container 20, the gas flow rate, the period of time during which plasma is generated, the self-bias and the kind of raw material in the same manner. Increase of the output of high frequency, decrease of the pressure of the raw gas in the container 20, decrease of the flow rate of the supplied gas, increase of the self-bias, decrease of the carbon number of the raw material and the like cause hardening of the DLC film, increase of the density thereof, increase of the compressive stress thereof and increase of the fragility thereof. Therefore, in order to obtain the maximum sorption suppressing effect to low molecular organic compound and the maximum gas barrier effect while maintaining an excellent adhesion and durability, it is preferable that the output of high frequency is set within a range from 50 to 1,000 W, the pressure of raw gas in the container 20 is set within a range from 0.2 to 0.01 torr, the flow rate of supplied gas is set within a range from 10 to 50 ml/min, the self-bias is set within a range from −200 to −1,000V, and the carbon number is set within a range from 1 to 8.

In order to enhance adhesion between the DLC film and the plastic material, the inner surface of the container 20 may be activated by plasma treatment with inorganic gas such as argon and oxygen before DLC film is formed.

Figure 4:
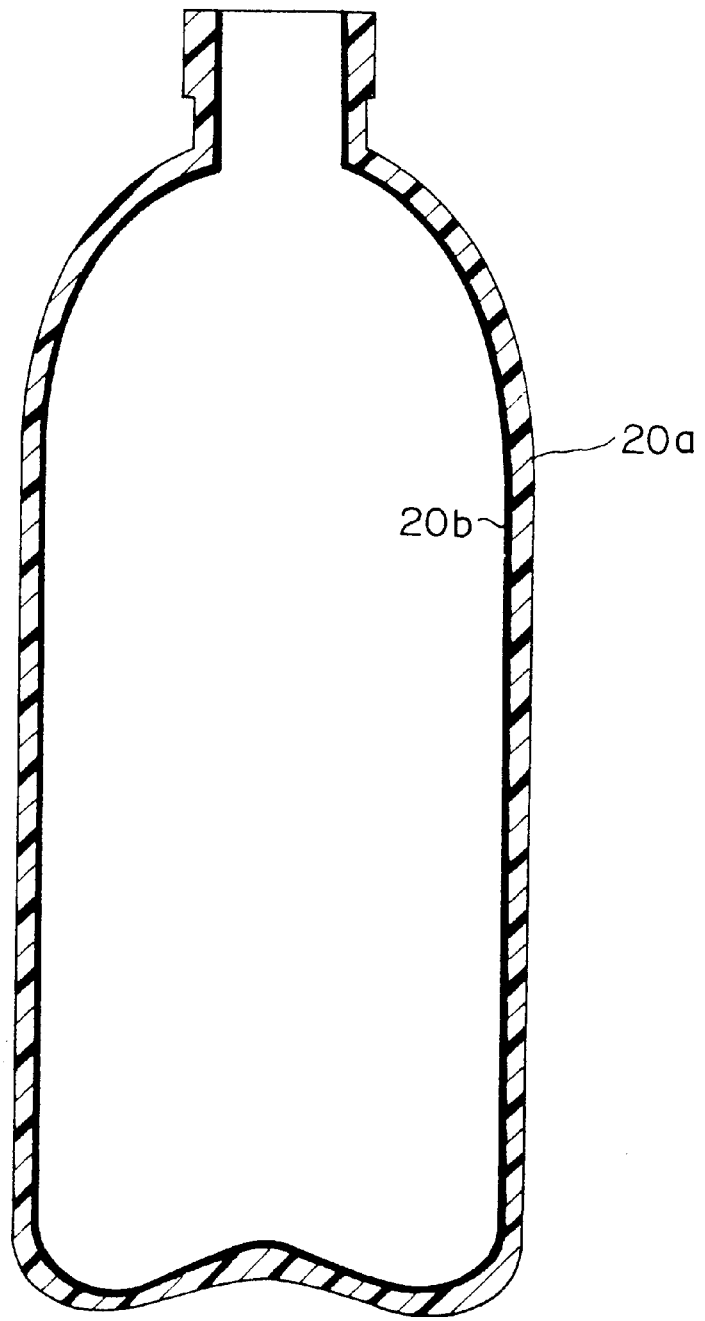
FIG. 4 is a longitudinally sectional view showing an embodiment of a plastic container coated with carbon film according to this invention.

FIG. 4 shows a longitudinal section of plastic container on which the DLC film is formed in the above manner. In FIG. 4, numeral numbers 20a and 20b show a plastic material and a DLC film formed on the inner surface of the plastic material 20a, respectively. In this manner, the plastic container whose inner surface is coated with the DLC film 20b can remarkably decrease permeability of low molecular inorganic gas such as oxygen and carbon dioxide, and simultaneously can completely suppress the sorption of various low molecular organic compounds having odor. Formation of the DLC film does not deteriorate transparency of the plastic container.

The following resins are used as plastic materials for containers 20: polyethylene resin, polypropylene resin, polystyrene resin, cycloolefine copolymer resin, polyethylene terephthalate resin, polyethylene naphthalate resin, ethylene-(vinyl alcohol) copolymer resin, poly-4-methylpentene-1 resin, poly (methyl methacrylate) resin, acrylonitrile resin, polyvinyl chloride resin, polyvinylidene chloride resin, styrene-acrylonitrile resin, acrylonitrile-butadien-styrene resin, polyamide resin, polyamideimide resin, polyacetal resin, polycarbonate resin, polybutylene terephthalate resin, ionomer resin, polysulfone resin, polytetra fluoroethylene resin and the like.

With respect to the container coated with carbon film manufactured by the above manufacturing apparatus and method, (1) Thickness of DLC film, (2) Density of DLC film, (3) Adhesion 1, (4) Adhesion 2, (5) Alkali resistance, (6) Carbon dioxide gas barrier property, (7) Oxygen gas barrier property and (8) Sorption of low molecular organic compound (aroma component) were evaluated in the following manners. The results were as follows:

(1) Thickness of DLC Film

Masking was previously made by Magic Marker (trade mark) on the inner surface of the container, and the DLC film was then formed. Thereafter, the masking was removed by diethyl ether, and thickness of the DLC film was measured by a surface shape measuring device (DECTACK 3) made by Vecco Company.

(2) Density of DLC Film

Difference in weight between containers without the DLC film and with the DLC film was measured, and the density of DLC film was calculated with the use of the thickness of the DLC film obtained in item (1).

(3) Adhesion 1

Adhesion of the DLC film formed on the side surface of the container was measured in accordance with cross-cut tape test (JIS K 5400) under the following conditions.

1. Distance between scratches: 1 mm
2. Number of checkers (lattices): 100

(4) Adhesion 2

Adhesion of the DLC film formed on the side surface of the container was measured by a continuously weighting type scratch tester (HEIDON 22) made by SHINTO KAGAKU company under the following conditions. Degree of adhesion was indicated by normal load exerted on a scratching needle when the film was started to be peeled off.
1. Material and shape of the scratching needle: diamond, 50 $\mu$R
2. Rate of loading: 100 g/min
3. Table speed: 1,000 mm/min

(5) Alkali Resistance

Alkali solution including sodium hydroxide of 10 wt % was filled into the container which was then immersed in a water bath at a temperature of 75° C. for 24 hours. Then, change of shape of the DLC film and existence of peeling of the DLC film were investigated. "Excellence" in the table shows that shape of DLC film was not changed and peeling thereof did not occur after the immersion for over 24 hours.

(6) Carbon Dioxide Barrier Property

Volume of carbon dioxide permeating the DLC film was measured by a PERMA TRANC-4 type machine made by MODERN CONTROL Company at a temperature of 25° C.

(7) Oxygen gas Barrier Property

Volume of oxygen permeating the DLC film was measured by an OXTRANTWIN machine made by MODERN CONTROL Company at a temperature of 40° C.

(8) Sorption of Low Molecular Organic Compound (Aroma Component)

Low molecular organic compound (aroma component) having odor was used as a kind of environmental material to test the sorption with reference to a method by MATSUI et al. (J. Agri. Food. Chem., 1992, 40, 1902–1905) in the following manner.
1. Model-flavor solution was prepared in such a manner that each aroma component (n-octane, n-octanal, n-octanol, ethyl hexanoate, and d-limonene) of 100 ppm was added to sugar ester solution to obtain 0.3% sugar ester solution.
2. The model flavor solution of 700 ml was poured into the container, the container was left at a temperature of 20° C. for one month after the mouth of the container was closed with the cover.
3. One month later, the model flavor solution was removed from the container to dry the interior of the container after the interior thereof was washed with distilled water of 60° C.
4. Diethyl ether was poured into the container to extract aroma component sorbed in the container.
5. The diethyl ether was taken out of the container to dehydrate the diethyl ether by adding sodium sulfuric anhydride thereto.
6. Quantitative analysis was performed by the gas chromatography in which amylbenzene was used as internal standard. In case that solution including aroma component of 1 ppm exists in the container, amount of the aroma component sorbed in the container is indicated by $\mu$g. Therefore, unit is $\mu$g/ppm/bottle.

[Test 1]

A plastic container having a volume of 700 ml and made of polyethylene terephthalate resin (PET resin, Type L125 made by MITSUI PET RESIN COMPANY LIMITED) was accommodated in the external electrode 12 as shown in FIG. 1 to be fixed thereto.

Then, the vacuum pump was operated to make the inside of the external electrode 12 vacuum (back pressure) of lower than $10^{-4}$ torr, and, thereafter, for preliminary treatment, argon was supplied into the plastic container at a flow rate of 30 ml/min to obtain a pressure of 0.04 torr in the container, and Rf power of 300W was supplied to perform plasma treatment on the inner surface of the container. Thereafter, raw gas such as toluene, cyclohexane, benzene or p-xylene was supplied into the interior of the container with using argon as auxiliary gas to uniformly form the DLC film on the inner surface of the container under the conditions shown in FIG. 5.

Result of Test

FIG. 6 shows the results of the evaluation with respect to thickness of film, film forming velocity, density of film, adhesion 1 of film, adhesion 2 of film and alkali resistance of film. The density of each film exceeded 2.00 g/cm$^3$, and the formed film was remarkably dense.

According to the cross-cut test, the adhesion to polyethylene terephthalate resin was good, and it was verified that the container was sufficient to be of practical use. Furthermore, it was found that alkali resistance was good, and the DLC film was stable enough to completely protect the polyethylene terephthalate resin.

The results of oxygen permeability, carbon dioxide permeability and degree of the sorption of each aroma component are shown in FIG. 7. Dense DLC film completely suppressed the sorption of aroma component, and simultaneously, effectively suppressed permeation of oxygen and carbon dioxide.

Figure 8:
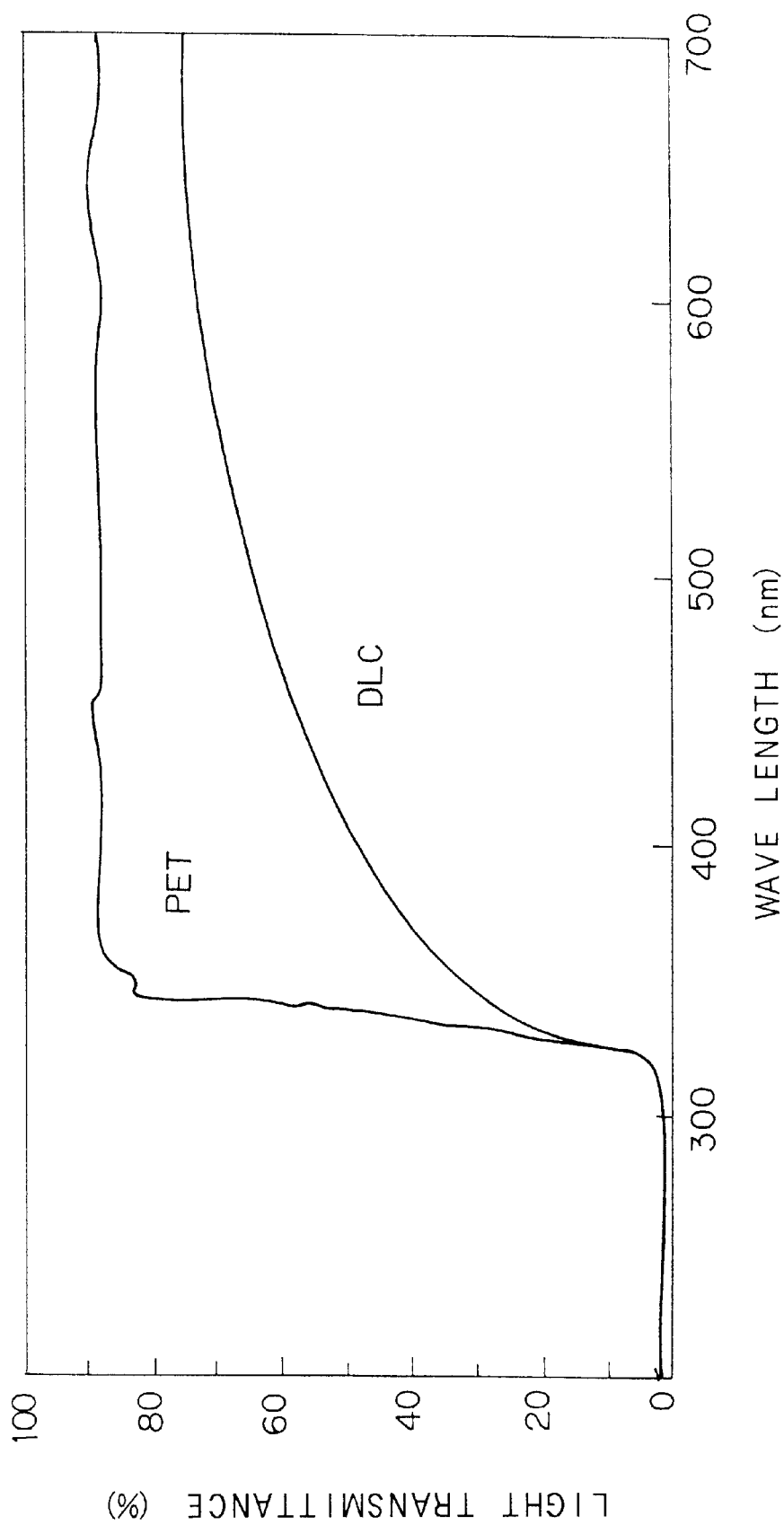
FIG. 8 is a graph showing transmitted light spectrum in the ultraviolet and visible region of the plastic container with the hard carbon film formed thereon under the conditions shown in FIG. 5.

In addition, FIG. 8 shows the transmitted light spectrum in ultraviolet and visible region at the barrel portion of the plastic container, the inner surface of which was coated with the DLC film.

Light transmittance rate was abruptly decreased in a region from approximately 500 nm of wave length to the ultraviolet region. This suggests that the coating with the use of the DLC film is effective enough to suppress the deterioration of contents by ultraviolet.

Figure 9:
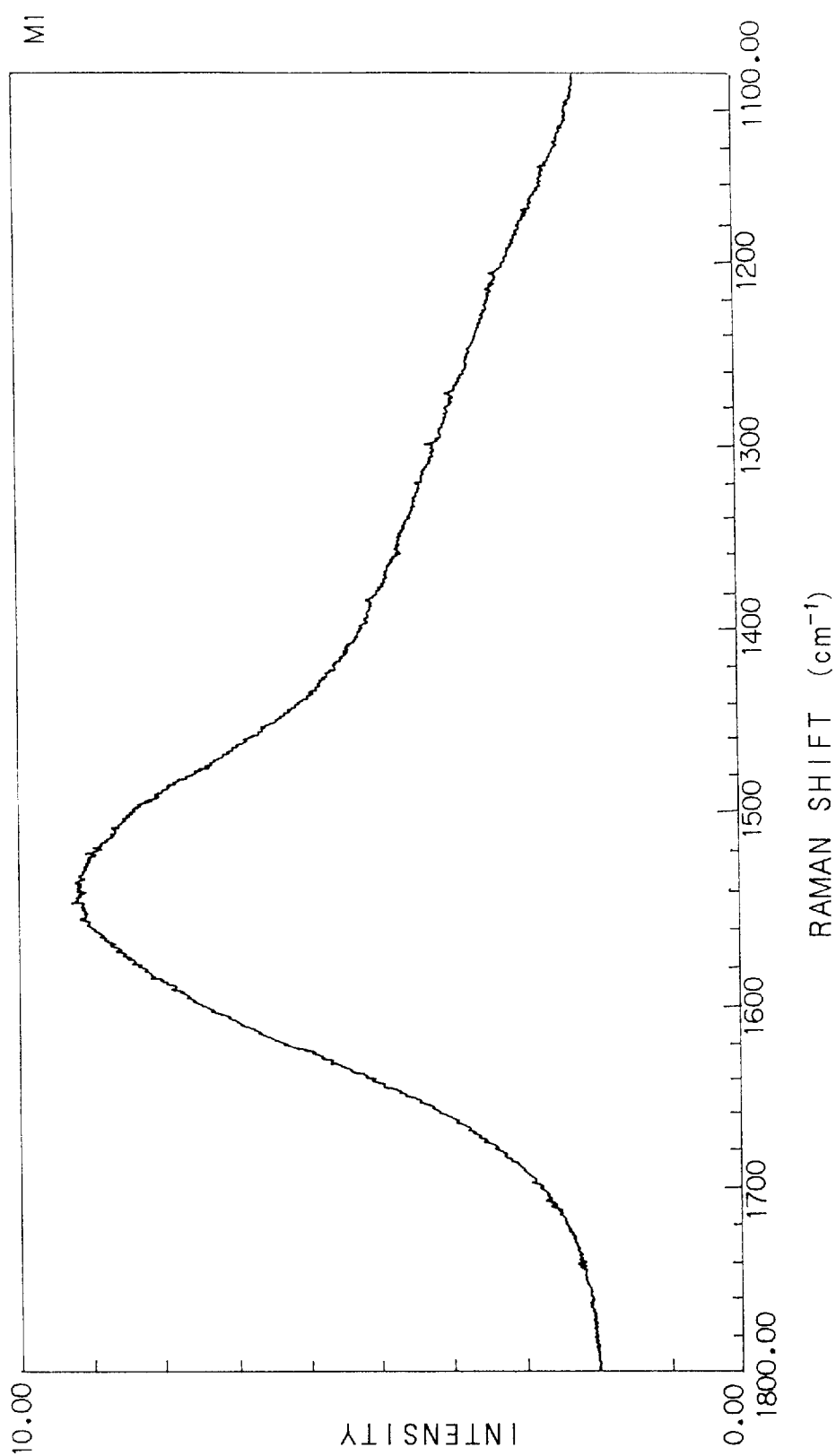
FIG. 9 is a graph showing Raman spectrum of the hard carbon film formed under the conditions shown in FIG. 5.
Figure 16:
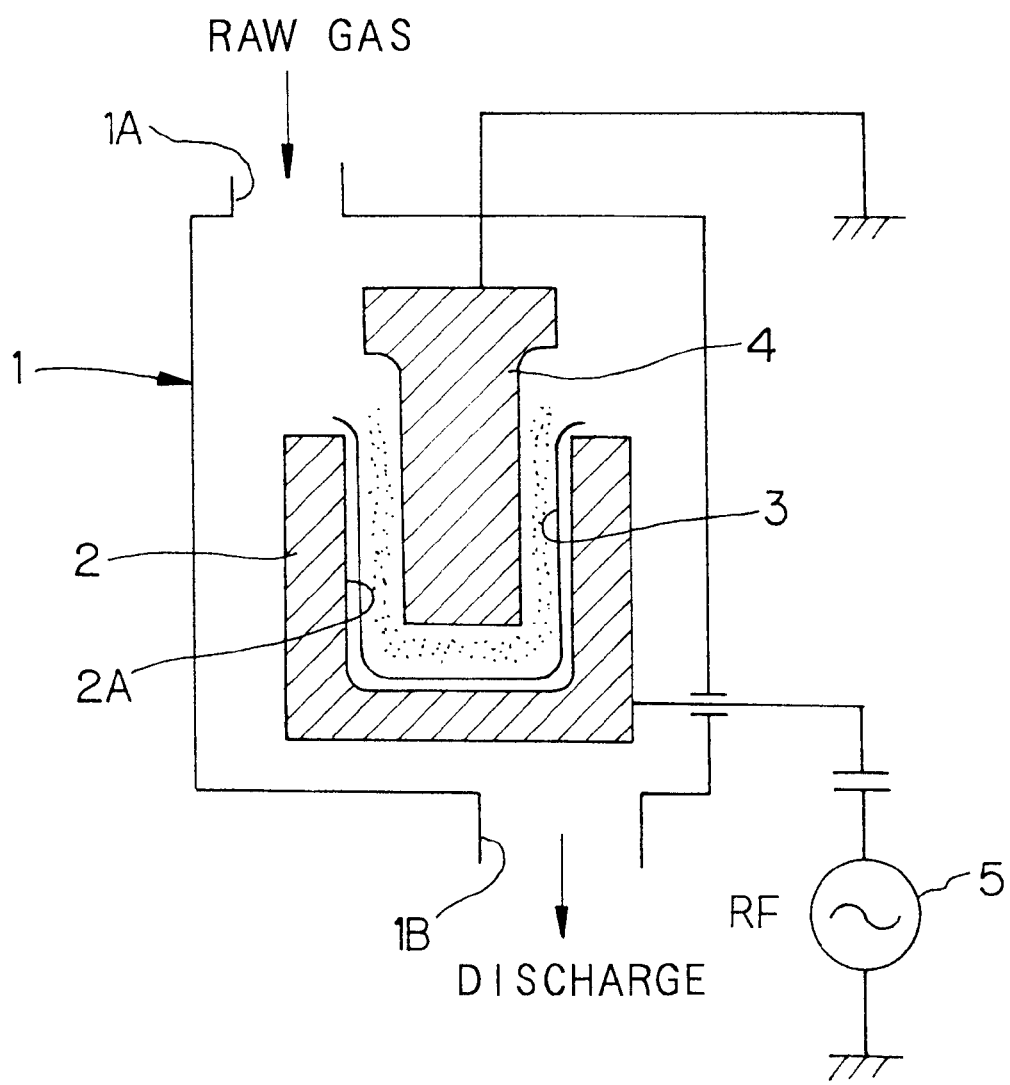
FIG. 16 is a longitudinally sectional view showing a prior art.

FIG. 9 shows Raman spectrum of the thin film formed on the barrel portion of the plastic container under the conditions of Test 1.

[Test 2]

The DLC film was formed on the inner surface of the container in the same manner as Test 1 except that a plastic container, having a volume of 700 ml made of styrene-aecrylonitrile copolymer resin (made by Mitsubishi Monsant Kasei Company: PAN resin, type L700) was used. The conditions for forming the DLC film are shown in FIG. 10. In the same manner as Test 1, tests were performed in connection with the DLC film, namely, thickness, density, adhesion 1, adhesion 2, alkali resistance, carbon dioxide barrier property, oxygen gas barrier property and sorption of low molecular organic compound.

Result of Test

The results of the test in connection with the DLC film, namely, thickness of film, film forming velocity, density of film, adhesion 1 of film, adhesion 2 of film and alkali resistance of film were shown in FIG. 11. The thickness of the film and the density thereof were good in the same way as Test 1. It was found that the adhesions 1 and 2 were good in the same way as Test 1 and the adhesion between the DLC film and the styrene-acrylonitrile copolymer was of practical use in the same way as that between DLC film and polyethylene terephthalate resin.

FIG. 12 shows oxygen permeability, carbon dioxide permeability and degree of sorption of each aroma component. More specifically, it was found that styrene-acrylonitrile copolymer resin was inherently excellent in gas barrier property, and further, the permeating amount of each of oxygen and carbon dioxide with respect to styrene-acrylonitrile copolymer resin was remarkably decreased to an extremely lower level by the formation of the DLC film. Amount of the sorption of each aroma component was smaller than the detectable limit, and there was no problem in sensory test in the same way as Test 1.

[Test 3]

The DLC film was formed on the inner surface of the container in the same manner as Test 1 except that a plastic container having a volume of 700 ml made of cycloolefine copolymer resin (made by MITSUI PETROCHEMICAL COMPANY LIMITED: COC resin, type APL 6015) was used. The conditions for forming the DLC film are shown in FIG. 13. In the same manner as Test 1, tests were performed in connection with the DLC film, namely, thickness of film, density of film, adhesion 1 of film, adhesion 2 of film, alkali resistance of film, carbon dioxide barrier property of film, oxygen gas barrier property of film and sorption of film to low molecular organic compound.

Result of Test

The results of each test in connection with the DLC film, namely, thickness of film, film forming velocity, density of film, adhesion 1 of film, adhesion 2 of film, alkali resistance of film are shown in FIG. 14. In the same manner as Tests 1 and 2, there was no problem with respect to all testing items, and, in particular, the adhesion between the DLC film and the plastic container was remarkably excellent.

FIG. 15 shows results of the oxygen permeability of the DLC film, the carbon dioxide permeability thereof and the sorption of each aroma component. Cycloolefine copolymer resin has comparatively large oxygen permeability carbon dioxide permeability and sorption of aroma components because it is olefine type resin. However, it was found that the formation of the DLC film on the container could considerably suppress the oxygen permeability, the carbon dioxide permeability and the sorption of aroma components.

INDUSTRIAL APPLICABILITY

The plastic container coated with carbon film of the invention can be used as a returnable container such as a bottle for beer, sake as well as beverage.

What is claimed is:

1. A method of recycling a container, the method comprising washing the container, and filling the washed container with a substance, wherein the container comprises an outer shell comprising a plastic, and a diamond-like carbon film bonded to an inside surface of the outer shell; and the diamond-like carbon film restrains adsorption by the container of an aroma component, which comprises low molecular organic compounds, to below a detectable limit.

2. The method of claim 1, wherein the container is a bottle used for beverages.

3. The method of claim 1, further comprising forming the diamond-like carbon film by a process comprising disposing an external electrode outside the container;

disposing an internal electrode inside the container, where the internal electrode supplies a gas to the inside of the container; and forming the diamond-like carbon film by plasma chemical vapor deposition.

4. The method of claim 1, further comprising forming the diamond-like carbon film by a process comprising placing a container enclosing a hollow space and having an inner and outer surface into a hallow space of an external electrode having an internal surface conforming in shape to the outside surface of the container;

providing for a vacuum between the internal surface of the external electrode and the outer surface of the container, all of the outer surface of the container being positioned at an about equal distance from the internal surface of the external electrode;

inserting an internal earthed electrode into the hollow space of the container;

providing a vacuum in the hollow space enclosed by the container;

introducing a gas of a precursor for forming the diamond-like carbon film into the hallow space enclosed by the container;

applying an AC voltage to the external electrode; and forming the diamond-like carbon film.

5. The method of claim 1, further comprising forming the diamond-like carbon film by a process comprising preparing an external electrode having a hollow space substantially similar to an external shape of the container and an internal grounded electrode having an external shape substantially similar to an internal shape of the container;

placing the container in the hollow space of the external electrode in such a manner than a distance between the bottle and the external electrode is kept approximately even at every position of the container;

inserting the internal electrode into the container in such a manner that a distance between the internal electrode and the container is kept approximately even at every position of the bottle;

providing a vacuum within a range of $10^{-2}$ to $10^{-5}$ torr in the hollow space of the external electrode;

introducing a gas of a precursor for forming the diamond-like carbon film into the container;

applying an AC voltage with an output of 50 to 1000 W to the external electrode; and forming the diamond-like carbon film.

6. The method of claim 1, wherein the diamond-like carbon film is from 0.05 to 5 $\mu$m thick.

7. The method of claim 1, wherein the plastic comprises at least one member selected from the group consisting of polyethylene resin, polypropylene resin, polystyrene resin, cycloolefin copolymer resin, polyethylene terephthalate resin, polyethylene naphthalate resin, ethylene-(vinyl alcohol) copolymer resin, poly-4-methylpentene-1 resin, poly(methylmethacrylate) resin, acrylonitrile resin, polyvinyl chloride resin, polyvinylidene chloride resin, styrene-acrylonitrile resin, acrylonitrile-butadiene-styrene resin, polyamide resin, polyamideimide resin, polyacetal resin, polycarbonate resin, polybutylene terephthalate resin, ionomer resin, polysulfone resin and polytetrafluoroethylene resin.

8. The method of claim 1, wherein
the plastic is selected from the group consisting of a polyethylene terephthalate resin and a styrene-acrylonitle copolymer resin;
the diamond-like carbon film has a density greater than 2.00 g/cm³; and
a permeating amount of oxygen in a day per a bottle capacity of one liter is less than 12.7 micro-liters.

9. The method of claim 1, wherein
the plastic comprises polyethylene terephthalate resin; and
the diamond-like carbon film has a density less than or equal to 2.84 g/cm³.

10. The method of claim 1, wherein
the plastic comprises styrene-acrylonitrile copolymer resin; and
the diamond-like carbon film has a density less than or equal to 2.94 g/cm³.

11. The method of claim 1, wherein
the aroma component comprises d-limonene; and
the diamond-like carbon film restrains sorption of the d-limonene by the container to substantially zero.

12. A method of recycling a container, the method comprising
washing the container, and
filling the washed container with a substance, wherein
the container comprises
an outer shell comprising a plastic, and
a diamond-like carbon film bonded to an inside surface of the outer shell; and
the diamond-like carbon film restrains adsorption by the container of an aroma component, which comprises low molecular organic compounds, to effectively zero.

* * * * *